US005260877A

United States Patent [19]

Drobny et al.

[11] Patent Number: 5,260,877

[45] Date of Patent: Nov. 9, 1993

[54] METHOD AND ARRANGEMENT FOR CONTROLLING AN INTERNAL COMBUSTION ENGINE WITH A DETECTING DEVICE UTILIZING TWO SENSORS FOR GENERATING SIGNALS WHICH CHANGE IN MUTUALLY OPPOSITE DIRECTIONS

[75] Inventors: Wolfgang Drobny, Besigheim; Werner Nitschke, Ditzingen; Reinhard Pfeufer, Möglingen; Johann Schmid, Cham; Hans-Peter Goldhammer, Landstuhl, all of Fed. Rep. of Germany

[73] Assignee: Robert Bosch GmbH, Stuttgart, Fed. Rep. of Germany

[21] Appl. No.: 653,261

[22] Filed: Feb. 11, 1991

[30] Foreign Application Priority Data

Feb. 10, 1990 [DE] Fed. Rep. of Germany ....... 4004085

[51] Int. Cl.[5] ...................... F02M 51/00; G01R 31/00

[52] U.S. Cl. ......................... 364/431.11; 364/571.01; 338/128; 338/153; 324/500; 324/522; 318/565; 123/479

[58] Field of Search ...................... 364/431.03, 431.07, 364/431.11, 431.05, 551.01, 571.01; 338/128, 130, 135, 153; 324/500, 503, 513, 522, 549; 123/399, 361, 479; 318/563, 564, 565

[56] References Cited

U.S. PATENT DOCUMENTS

| | | | |
|---|---|---|---|
| 3,983,851 | 10/1976 | Hoshi | 364/431.07 X |
| 4,603,675 | 8/1986 | Junginger et al. | 123/478 |
| 4,693,111 | 9/1987 | Arnold et al. | 73/118.1 |
| 4,920,939 | 5/1990 | Gale | 324/549 X |
| 4,972,816 | 11/1990 | Mausner | 324/549 X |
| 5,065,721 | 11/1991 | Wiggins et al. | 123/399 |

FOREIGN PATENT DOCUMENTS

| | | | |
|---|---|---|---|
| 3621937A1 | 1/1988 | Fed. Rep. of Germany . | |
| 2-294002 | 12/1990 | Japan | 338/130 |

*Primary Examiner*—Jack B. Harvey
*Assistant Examiner*—Edward Pipala
*Attorney, Agent, or Firm*—Walter Ottesen

[57] ABSTRACT

A method and an arrangement for electronically controlling an internal combustion engine of a motor vehicle. The detecting unit is connected to a component determining the power of the engine such as a throttle flap or a control rod or an accelerator pedal and generates at least two position signals. The detecting unit is so configured that with a position change of the power-determining component, the two position signal variables change in opposition. A fault detection associated with this kind of measure permits detecting short circuits as well as shunt faults between the potentiometer wipers.

15 Claims, 2 Drawing Sheets

METHOD AND ARRANGEMENT FOR CONTROLLING AN INTERNAL COMBUSTION ENGINE WITH A DETECTING DEVICE UTILIZING TWO SENSORS FOR GENERATING SIGNALS WHICH CHANGE IN MUTUALLY OPPOSITE DIRECTIONS

FIELD OF THE INVENTION

The invention relates to a method and an arrangement for electronically controlling (open loop and/or closed loop) an internal combustion engine of a motor vehicle.

BACKGROUND OF THE INVENTION

A method and an arrangement of the above type are disclosed in United States patent application Ser. No. 165,276, now abandoned, filed on Feb. 26, 1988. Here, a monitoring arrangement for an electronic control apparatus in a motor vehicle is disclosed with a detecting unit for detecting an operating parameter of the engine and/or of the vehicle. The detecting unit detects especially the particular position of a component determining the power of the engine such as the throttle flap or control rod and/or accelerator pedal. The signal values emitted by the detecting unit are compared to pregiven limit values so that a conclusion can be drawn as to defect conditions in the detecting unit.

This procedure cannot ensure a reliable check of the particular detecting unit since it is possible that types of defects which occur such as shunts with stray resistance between signal leads and supply voltage cannot be detected and therefore driving conditions can develop which are nonetheless critical with respect to safety.

SUMMARY OF THE INVENTION

It is an object of the invention to provide measures with respect to the control of an internal combustion engine which assist in ensuring an encompassing monitoring of reliability. According to a feature of the invention, the detecting unit for an operating parameter of the engine or of the vehicle generates several signals representing the operating parameter which are configured such that the signal variables change in mutually opposite directions when there is a change of the operating parameter detected by the detecting unit. Possibilities are provided for detecting in large measure defective functions of the detecting unit from a comparison of signal variables configured in this manner.

U.S. Pat. No. 4,603,675 discloses an electronic accelerator pedal system of a vehicle with a detecting unit associated with the accelerator pedal. The detecting unit generates at least one signal representing the position of the accelerator pedal and, in dependence upon this signal, at least a control of the throttle flap position and thereby of the air supply to the engine can be undertaken. The detecting unit comprises two potentiometers connected to the accelerator pedal. To check the operating capability of the detecting unit, the actuating signal of the one potentiometer is compared in a logic unit to a threshold value derived from the actuating signal of the second potentiometer and, in this way, the correct operation of the detecting unit, and especially of the first potentiometer, is determined. A procedure of this kind cannot ensure a reliable check of the particular detecting unit since it is possible that types of defects occur such as shunts between the two potentiometer wipers or non-linearities of the potentiometers which cannot be detected.

U.S. Pat. No. 4,693,111 discloses a position detecting unit for a movable part in a motor vehicle. This detecting unit is configured as a multi-track potentiometer and functions to improve the resolution of the positions detected in pregiven component ranges of the position of the component which is connected to the detecting unit.

SUMMARY OF THE INVENTION

The invention affords the advantage that by means of the electrical opposition of the signals emitted from the detecting unit comprising several sensors non-linearities of the detecting unit and deviations of characteristics as well as shunts between the signal lines of the sensors can be detected. In this way, an overall monitoring of reliability of the detecting unit is ensured with the procedure according to the invention.

The method of the invention affords special advantages in combination with a detecting unit configured as a double potentiometer for detecting the position of a power-determining component such as a throttle flap, control rod and/or an actuating member actuable by the driver such as the accelerator pedal of an electronic accelerator.

Further advantages are afforded by providing different resistance values for the two resistance tracks of the double potentiometer. For electrically opposite resistance tracks having the same resistance value and in the case of a shunt fault, a value occurs between the wipers which corresponds to a mean deviation. With error conditions of this type and by selecting different resistance values, a resultant voltage value occurs which corresponds to a lesser deflection.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
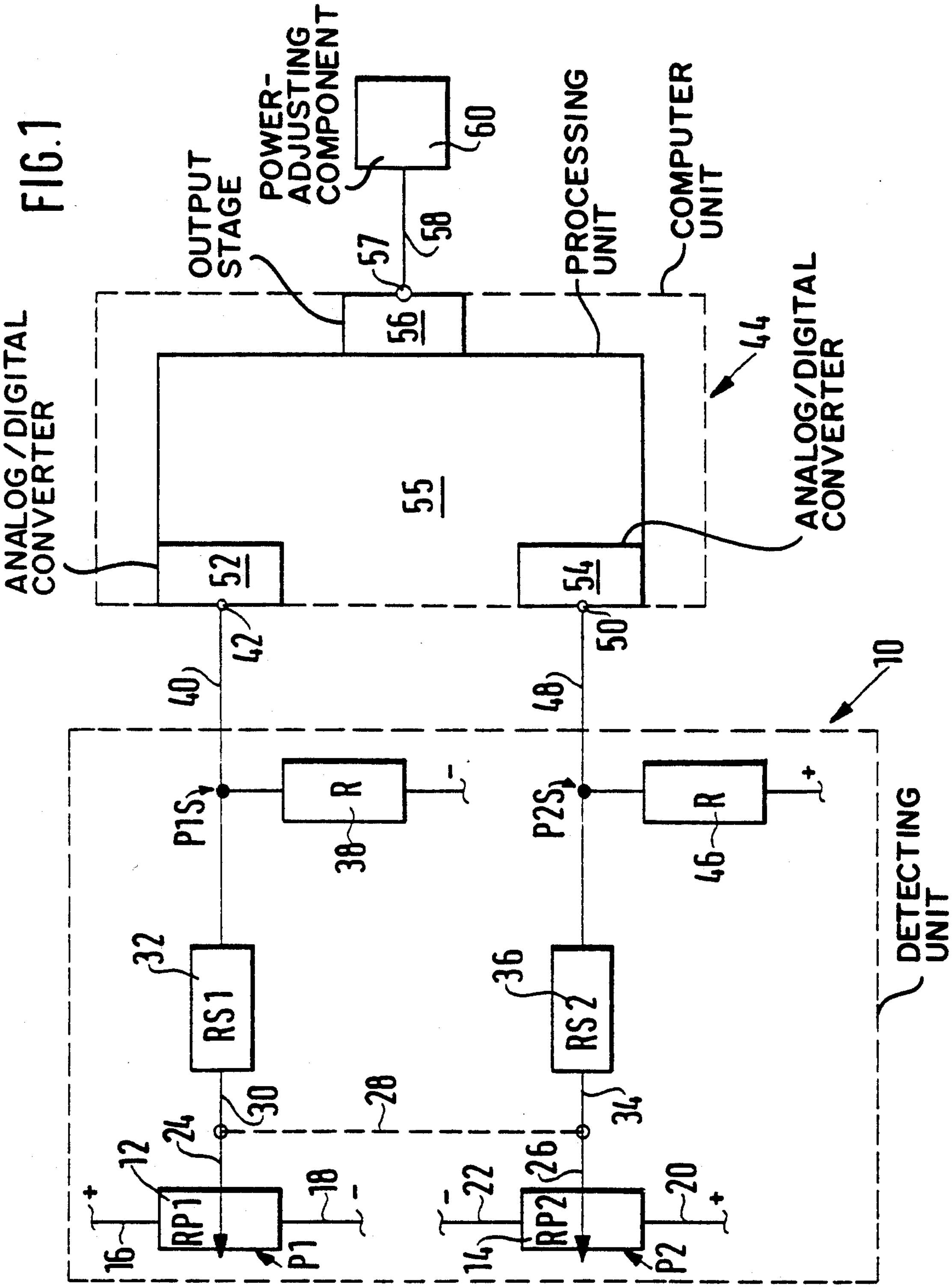
FIG. 1 is a block diagram of an embodiment of the arrangement of the invention for electronically controlling an internal combustion engine of a motor vehicle; and, FIG. 2 is a flowchart for explaining the procedure for checking the operation of a detecting unit and for explaining the measures which are initiated in the event functional inoperability is detected.

FIG. 1 shows a detecting unit 10 for detecting the position of an element (not shown) of a vehicle determining the power of the engine. The element can, for example, be a power-positioning component such as a throttle flap or control rod and/or an accelerator pedal of an electronic accelerator system. The detecting unit 10 includes two sensors or transducers P1 and P2 which are shown in FIG. 1 as a so-called double potentiometer. The resistance track 12 is connected via its line 16 to the positive pole of the supply voltage and via the line 18 to the negative pole of the supply voltage. The resistance track 14 of the sensor P2 is connected via line 20 to the positive pole of the supply voltage and via line 22 to the negative pole of the supply voltage. The movable wipers (24, 26) slide over resistance tracks (12, 14), respectively, and are connected to respective power-determining components of the vehicle. The two wipers (24, 26) are coupled with each other via a mechanical connection 28 so that they both move parallel to each other in the same direction in dependence upon the power-determining component (not shown).

The wiper 24 sliding over the first resistance track 12 is connected via a line 30 and a resistor 32 having the resistance value RS1 to a connecting node P1S; whereas, the wiper 26 sliding on the second resistance track 14 is connected via a line 34 and the resistance 36 having the resistance value RS2 to a connecting node P2S. A resistance 38 having the resistance value R is connected with its first terminal to the connecting node P1S. A line 40 is also connected to connecting node P1S and connects the computer unit 44 thereto. The resistor 38 is connected with its second terminal to the negative pole of the supply voltage.

In the same manner, the resistor 46 having the resistance value R and the line 48, which connects connecting node P2S to a computation and evaluation unit 44, are connected to the connecting node P2S. In contrast to the arrangement at the first sensor P1, in this case, the other terminal of the resistor 46 is connected to the positive pole of the supply voltage in correspondence to the electrical opposition of the two sensors.

The connecting line 40 connects the connecting node P1S of the first sensor to an input 42 of the computation and evaluation or computer unit 44; whereas, the line 48 connects the connecting node P2S of the second sensor to a second input 50 of the computer unit 44. The computer unit 44 includes the following: an analog/digital-converter 52 having the input 42, a second analog/digital-converter 54 having the second input 50, a processing unit 55 as well as an output stage 56. The output stage 56 has the output 57 of the computer unit 44 which is connected to the line 58 which, in turn, connects the computer unit 44 to an arrangement 60 for influencing an operating parameter of an internal combustion engine.

In a preferred embodiment of the invention, the arrangement 60 can constitute a power-adjusting component such as a throttle flap for controlling the air flow to the engine or a control rod for influencing the quantity of fuel metered to the engine or an arrangement for driving injection valves. The power-adjusting component is provided with an electrically actuable positioning motor.

In addition to the inputs and outputs shown in FIG. 1, the computer unit 44 includes other inputs and outputs (not shown) which function for carrying out further control functions such as ignition, fuel injection and/or idle control.

The operation of the arrangement shown in FIG. 1 will now be described.

The power-determining component of the vehicle or of the engine in the preferred embodiment can be a throttle flap or control rod and/or an accelerator pedal of an electronic accelerator system. The power-determining component is rigidly connected to the two wipers 24 and 26 as well as to the two signal lines 30 and 34 of the sensors P1 and P2, respectively, so that a position change of this component causes a corresponding position change of the two wipers 24 and 26. The mechanical connection 28 causes a position change of the two wipers in the same direction at the same time.

A movement of the throttle flap in the direction of its fully opened position corresponds, for example, to a change of the wiper 24 in the direction of the positive terminal of the first resistance track and the movement of wiper 26 in the direction of the negative terminal of the second resistance track. The connecting nodes P1S and P2S then lie corresponding to the positions of the respective wipers 24 and 26 at respective potential values formed by the respective sets of resistors (RS1 and R) and (RS2 and R). These potential values are a measure of the respective positions of the wipers and therefore for the position of the power-determining component. In this regard, attention is called to the fact that a change of the position of the power-determining component in the direction of a greater opening leads to an increase of the potential at the connecting node P1S and to a reduction of the potential at connecting node P2S. Accordingly, the two sensors respond in opposite electrical directions. The two voltage values corresponding to the positions of the sensors P1 and P2 are conducted to the respective inputs 42 and 50 of the computer unit 44 via the respective connecting leads 40 and 48. The analog/digital converters corresponding to the inputs form digital signals from the analog voltage signals for further processing in the processing unit 55. The voltage signals are converted in the processing unit 55 into corresponding position values for the particular power-determining component of the motor vehicle or the engine, and based on these position values, effect a corresponding control of the arrangement 60 via the output stage 56 with the position values corresponding to a desired value or an actual value in the case of an electronic accelerator pedal system.

Values are read into the processing unit 55 via the inputs 42 and 50 and respective analog/digital converters 52 and 54. To improve the reliability of the system, these values are checked individually and with respect to each other in order to determine whether the detecting unit 10 operates correctly. In addition, provision is made to carry out appropriate measures in the case of a detected operational fault.

Figure 2:
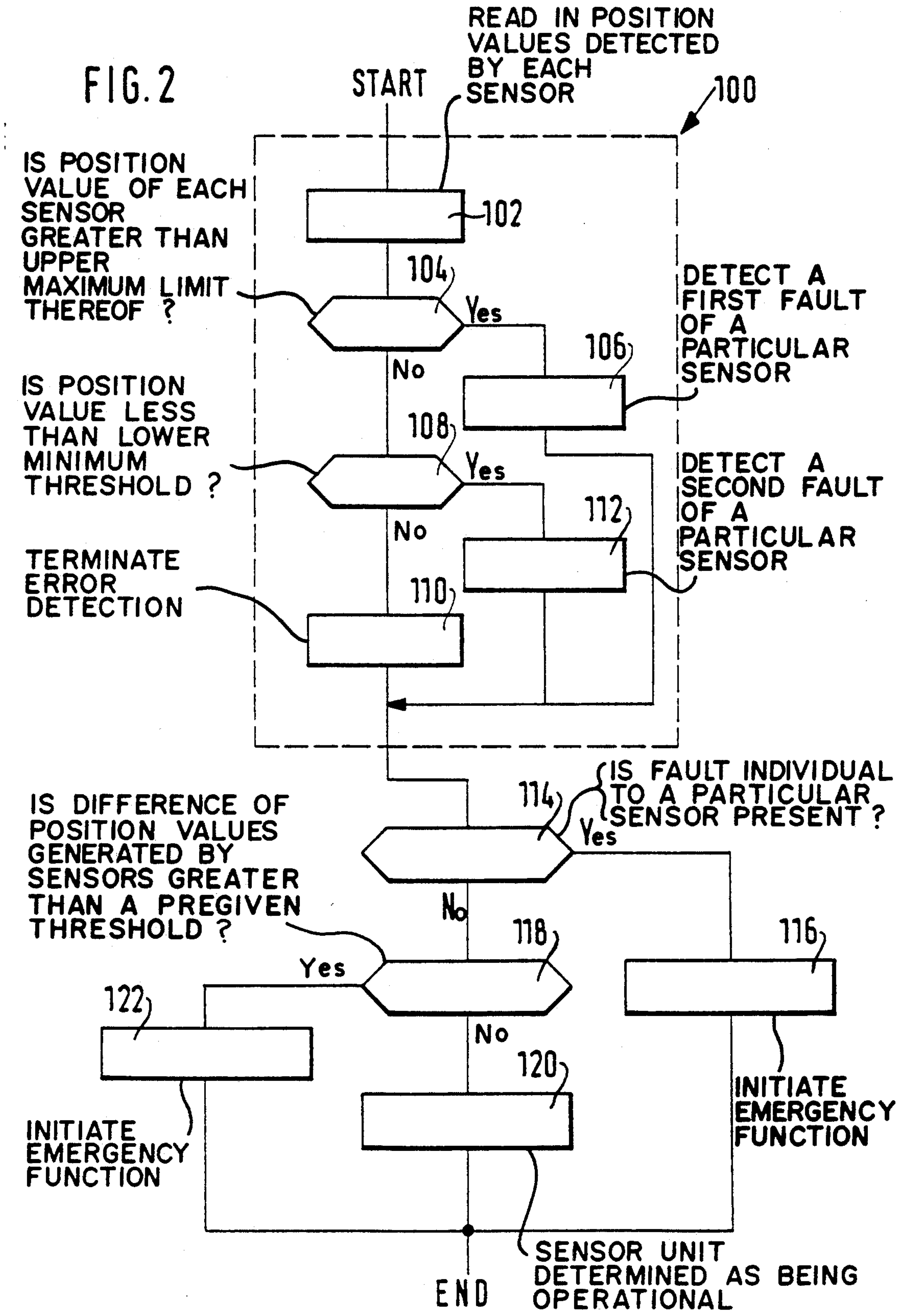

The procedure for checking the function of the detecting unit 10 and the measures to be initiated when an operational fault is detected are shown in FIG. 2 with respect to a flowchart carried out in the processing unit 55.

After the start of the program part shown in FIG. 2, a subportion of the program part is run through in function block 100 to detect individual faults of both sensors P1 and P2. This individual fault detection is undertaken separately for each sensor and begins in correspondence to step 102 in that the position values detected by each sensor are read in and compared to their upper maximum limit in the inquiry block 104. If in step 104, the detection is made that the position value of the particular sensor is greater than its maximum permissible value, then an individual fault of the particular sensor is detected in block 106 and a corresponding mark is set and the program part is continued. An individual fault detected in step 106 indicates a short circuit either from the negative to the positive pole of the supply voltage of the sensor or from the connecting node P1S or P2S to the positive pole of the supply voltage or an interruption of the terminal at the negative pole of the supply voltage of the particular sensor. A corresponding mark can likewise be set in step 106.

If in step 104 the determination is made that the particular position value is below its upper limit, then in step 108 a check is made if the position value is less than a lower minimum threshold. In the opposite case, the individual error detection is terminated in step 110 in that a mark is set for the functional operability of the individual sensors. If in step 108, the position value of the particular sensor is below the pregiven minimum value, then in step 112, a second individual fault is detected and a corresponding mark is set. This second individual fault can indicate the following: a short circuit from the positive pole of the supply voltage to the negative pole thereof; a short circuit from the connecting node P1S or P2S to the negative pole of the supply voltage; or, interruptions of the positive supply voltage lines or of the wiper lines or the connecting lines.

Thereafter, the operation continues with the inquiry 114 with which the presence of an individual fault is determined. If such an individual fault is present, then an emergency function is initiated in step 116. This emergency function can comprise either a shutdown of the equipment or the function of the system can be continued on the basis of the sensor which operates correctly. After step 116, the program part is ended and is again run through.

If the determination is made in step 114 that no individual error is present, then the operational capability of the entire detecting unit 10 is checked in step 118 in that the amount of a difference of the position values generated by the sensors is compared to a pregiven threshold. If the difference amount is below the pregiven threshold, the functional capability of the detecting unit is determined in step 120 and the system function is taken up as normal operation. However, if the difference according to step 118 is above the pregiven threshold, then a mark is set in step 122 for a fault of the detecting unit and an emergency function is initiated.

A fault detection in step 122 indicates shunt faults between the supply voltage poles and the wiper connecting nodes with a shunt fault being associated with a finite transfer resistance in contrast to the short circuit. The emergency measure taken in step 122 can comprise either a shutoff of the system or a continuation of the system function on the basis of the particular lesser position value. The program part is ended after steps 120 and 122 and is again started as required.

Even shunt circuits between the two wiper lines or connecting lines can be determined by means of the electrical opposition of the two sensors and the comparison of the amount of the difference between the position values which represent the position of the power-determining component. Such an error detection is not possible with uni-directional sensors. In the event of the defect condition of a shunt fault between the two connecting nodes P1S and P2S, an additional advantage which improves the functional reliability of the system is realized because of the different selection of the resistance values of the resistance tracks of the double potentiometer as well as the different selection of the resistances RS1 and RS2. This advantage is characterized for such an error condition that the particular mechanically smaller value is assumed as the resulting value and therefore the throttle flap or control rod is held to a smaller opening cross section in the case of an electronic accelerator pedal system.

The procedure of the invention is also applicable to detecting units having several sensors with at least one of the sensor being in electrical opposition compared to the other sensors and the positioning signal of this sensor or these sensors operating to check the operation of the other sensors.

A further advantageous configuration of the detecting unit according to FIG. 1 results from the different selection of the resistance values of the resistors 38 and 46. This measure, also in combination with the dimensioning of the resistances 32 and 36 and/or of the resistance tracks 12 and 14, leads to the advantages described above with respect to the selection of the resistances of the resistance tracks 12 and 14.

The procedure according to the invention is described in the foregoing with respect to a position transducer. However, it is in principle applicable to other transducer or sensor arrangements detecting operating parameters of the internal combustion engine.

It is understood that the foregoing description is that of the preferred embodiments of the invention and that various changes and modifications may be made thereto without departing from the spirit and scope of the invention as defined in the appended claims.

What is claimed is:

1. A method for electronically controlling an internal combustion engine of a motor vehicle, the method comprising the steps of:

generating two signal variables by means of a detecting unit with the signals representing at least one detected operating parameter of the engine or the motor vehicle;

forming said signals so as to cause said signals to change in mutually opposite directions in response to a change in said operating parameter; and, applying said signals to a processing unit for driving a component of the engine or the motor vehicle to vary said operating parameter and for checking the functional capability of the detecting unit by evaluating said signals.

2. The method of claim 1, wherein said detecting unit generates signal variables indicative of the position of a power-determining component of the engine or motor vehicle.

3. The method of claim 2, said power-determining component being a power-setting member.

4. The method of claim 2, said power-determining component being an accelerator pedal.

5. The method of claim 2, said detecting unit including a double potentiometer having respective different resistance values corresponding to respective ones of the individual potentiometers.

6. The method of claim 1, the method comprising the further steps of:

checking the signals individually with respect to a permissible value range for detecting individual faults;

checking the difference of said signals with a pregiven limit value for detecting fault conditions in the area of said detecting unit; and, in the event of a fault, initiating an emergency measure.

7. The method of claim 6, wherein the emergency measure is characterized as a switch-off of the control system.

8. The method of claim 6, wherein the emergency measure is characterized as a continuation of the operation of the control system in dependence upon a signal not subjected to the fault.

9. An arrangement for electronically controlling an internal combustion engine of a motor vehicle which includes a component for varying an operating parameter thereof, the arrangement comprising:

a detecting unit having two sensors operatively connected to the component for generating first and second signals, respectively, indicative of the operating parameter of the engine or of the motor vehicle;

said detecting unit being configured so as to cause said first and second signals to change in mutually opposite directions in response to a change of said operating parameter; and, processing means for driving said component and checking said signals individually and with respect to each other to determine whether said detecting unit is operating correctly.

10. The arrangement of claim 9, wherein said component is a powder-determining component and said operating parameter corresponds to a position of the power-determining component; and, said sensors of said detecting unit being respective position transducers operatively connected to said power-determining component.

11. The arrangement of claim 10, said two position transducers being configured as respective potentiometers having different resistance values; and, said potentiometers being connected to said power-determining component.

12. The arrangement of claim 9, said processing means comprising a computation and evaluation unit for evaluating said first and second signals to check the operability of said sensors.

13. The arrangement of claim 9, said potentiometers conjointly defining a double potentiometer having two individual potentiometers; and, voltage supply means being connected to said potentiometers so as to cause said potentiometers to have opposite polarity.

14. The arrangement of claim 9, further comprising a computation and evaluation unit for receiving said signals separately for further processing.

15. The arrangement of claim 9, further comprising a computation and evaluation unit for receiving said signals jointly for further processing.

* * * * *